United States Patent [19]

Hayasaka et al.

[11] Patent Number: 5,290,733
[45] Date of Patent: Mar. 1, 1994

[54] METHOD OF MANUFACTURING SEMICONDUCTOR DEVICES INCLUDING DEPOSITING ALUMINUM ON ALUMINUM LEADS

[75] Inventors: Nobuo Hayasaka, Kanagawa; Ayako Shimazaki; Haruo Okano, both of Tokyo, all of Japan

[73] Assignee: Kabushiki Kaisha Toshiba, Kawasaki, Japan

[21] Appl. No.: 925,287

[22] Filed: Aug. 6, 1992

Related U.S. Application Data

[63] Continuation of Ser. No. 764,964, Sep. 25, 1991, abandoned, which is a continuation of Ser. No. 370,801, Jun. 23, 1989, abandoned.

[30] Foreign Application Priority Data

Jun. 23, 1988 [JP] Japan ................................. 63-153512
Sep. 30, 1988 [JP] Japan ................................. 63-246454

[51] Int. Cl.$^5$ .......................................... H01L 21/44
[52] U.S. Cl. .................................. 437/194; 437/225; 437/230; 156/643; 427/98
[58] Field of Search .................. 437/225, 230, 194; 427/98; 156/643

[56] References Cited

U.S. PATENT DOCUMENTS

| | | | |
|---|---|---|---|
| 4,351,696 | 9/1982 | Radigan | 156/643 |
| 4,547,260 | 10/1985 | Takada et al. | 156/643 |
| 4,581,101 | 4/1986 | Senoue et al. | 156/643 |
| 4,668,335 | 5/1987 | Mockler et al. | 156/643 |

OTHER PUBLICATIONS

S. Wolf et al., *Silicon Processing for the VLSI Era*, vol. 1, Lattice Press, Sunset Beach, Calif., 1986 pp. 559–564.

*Primary Examiner*—Brian E. Hearn
*Assistant Examiner*—Laura M. Holtzman
*Attorney, Agent, or Firm*—Oblon, Spivak, McClelland, Maier & Neustadt

[57] ABSTRACT

A method of manufacturing semiconductor devices comprises steps of selectively forming metal leads on the surface a semiconductor substrate, and immersing the semiconductor substrate in a solution containing dissolved metal for depositing the dissolved metal on the surfaces of the metal leads. The solution contains dissolved metal having an ionization tendency equal to or smaller than ionization of the metal leads.

6 Claims, 7 Drawing Sheets

METHOD OF MANUFACTURING SEMICONDUCTOR DEVICES INCLUDING DEPOSITING ALUMINUM ON ALUMINUM LEADS

This is a continuation of application Ser. No. 07/764,964, filed on Sep. 25, 1991, now abandoned which is a continuation of application Ser. No. 07/370,801, filed on Jun. 23, 1989, now abandoned.

BACKGROUND OF THE INVENTION

1. Field of the Invention

This invention relates to a method of manufacturing semiconductor devices, and more particularly to a method of processing the surfaces of metal leads of the device so as to suppress corrosion thereof. The invention also relates to a method of selectively depositing metal on prescribed portions of the device.

2. Description of the Prior Art

In a conventional method of manufacturing semiconductor devices, the metal leads of most devices are formed using materials such as Al, an Al-Si alloy or an Al-Si-Cu alloy. The metal leads of such devices are generally formed as follows. Specifically, a thin metal film is formed on a semiconductor substrate by the use of a vacuum evaporation technique, a sputtering technique or the like. Next, a photoresist is painted on the thin metal film so as to form a photoresist film. The photoresist film is then patterned in a prescribed manner. Thereafter, the thin metal film is selectively etched using the thus patterned photoresist film as a mask. This is performed by the use of a dry-etching technique such as an RIE (reactive ion etching) technique or the like. As a result, the thin metal film is formed into metal leads having a prescribed pattern. In general, gas of the Cl group is used for etching metals such as Al or an Al-alloy. However, after such a dry-etching process using the Cl group gas, Cl remains on the surface of the thin film of Al or an Al-alloy. The remaining Cl corrodes the Al film or an Al-alloy film, which is exposed to air without any protection. If one of metal leads is corroded in a semiconductor device, such a metal lead can be broken when the device is operated. This is because the current density in the metal lead becomes abnormally higher. As a result, reliability of the device is significantly lowered.

To prevent the above-described corrosion, the following techniques have been generally employed after the dry-etching process, such as the RIE. Specifically, a technique has been employed in which an electrical discharge is performed using gas of the F group. This causes the surfaces of the metal leads to be fluorinated. Another technique has been employed in which the metal leads are washed with water immediately after the RIE. Another technique has been employed in which heated inert gas is supplied to the metal leads after the RIE. Still another technique has been employed in which a semiconductor substrate to be processed is heated by a heater. The surfaces of metal leads are processed by one of the above-described techniques. Thereafter, the photoresist, which has been used as a mask, is eliminated. Next, the substrate to be processed is further washed with water. In this process, F or Cl still adheres to the surfaces of metal leads. As a result, corrosion of the metal leads inevitably occurs.

FIG. 10 is a schematic perspective view illustrating a part of a conventional semiconductor device. In FIG. 10, a silicon oxide film 102 is formed on the surface of a silicon substrate 101. Next, a metal lead film made of an Al-Si-Cu alloy is formed on the silicon oxide film 102. Thereafter, the metal lead film is selectively etched using a photoresist (not shown) as a mask so as to form metal leads 103. FIG. 10 shows a state in which the photoresist has been eliminated. The substrate 101 of FIG. 10 is washed with high-purity water. In this process, a corroded portion 104 appears at a portion of the metal leads 103 as shown in FIG. 11. This corrosion is caused by F and Cl adhered to the surfaces of metal leads 103. Assume that a semiconductor device is finished leaving the corroded portion 104. When such a device is actually operated, the electric current density in the thinned portion 104 becomes higher. As a result, the portion 104 of metal leads 103 can be easily broken, causing disconnection of the circuit. This significantly lowers the reliability of the semiconductor device.

In the process of eliminating the photoresist, an ashing technique using $O_2$ gas excitation has been employed. However, in recent years, an ashing technique using gas of the F group has been employed in some cases. In such cases, the metal leads are exposed to gas of the F group, thus F remains on the surfaces of the metal leads. As a result, corrosion occurs more frequently than the case when $O_2$ gas is used.

Further, such corrosion occurs most significantly in the metal leads of an Al-Si-Cu alloy as compared to those of an Al-Si alloy and to those of Al (least). The reason to use such an alloy is that the electromigration in the metal leads can be significantly suppressed when they are made of an alloy, in particular, of an Al-Si-Cu alloy. Namely, the highest reliability of metal leads can be obtained when an Al-Si-Cu alloy is used. However, metal leads of an alloy have other disadvantages as follows. Specifically, oxidation and reduction can occur in a water solution because of the electrode potential difference between two different metals (i.e., cell effect). For example, in the case of an Al-Si-Cu alloy, corrosion accompanied with the growth of $AL(OH)_3$ occurs when the surfaces of metal leads are exposed to the water solution. This corrosion occurs even when F or Cl does not exist on the metal lead surfaces.

In the process of forming metal leads, a technique in which metal is selectively deposited on metal portions or semiconductors has many advantages. However, only limited numbers of such techniques are available at present. For example, in one technique, W is selectively deposited on W or Si by using $WF_6$ gas. This technique has advantage as follows. Specifically, the difference in reactive characteristics between a base material and W or Si on which W is deposited can be effectively utilized. However, this technique also has disadvantages as follows. Specifically, this requires a vacuum apparatus. Further, it is difficult to safely handle $WF_6$ gas. Moreover, this technique is only applicable to W, i.e., no other materials can be used. In another technique, metal is selectivley deposited on prescribed portions of a substrate by using laser beams or electron beams. Specifically, metal is deposited only on prescribed portions to which laser beams or electron beams are applied. This technique is applicable to various metals other than W. The experimental results using this technique can be easily obtained.

For example, literature on this technique, such as D. J Erhlick et al, J.Vac.Sci. & Tech. vol.21, No.1, P.23, 1982, is known. However, this technique requires a large scale system in which laser beams or electron beams are applied to a substrate situated in an atmosphere of gas (or in a solution) containing metal. Therefore, this technique is at present very far from the stage of practical application in view of its higher manufacturing costs and lower productivity.

As described above, in the conventional process of manufacturing semiconductor devices, corrosion of metal leads inevitably occurs, causing reliability of the device to be lowered. Moreover, it is extremely difficult to selectively deposit various metals other than W on the metal and semiconductor portions of the device.

SUMMARY OF THE INVENTION

Accordingly, one object of this invention is to provide a method of manufacturing semiconductor devices, in particular, a method of processing the surfaces of metal leads, so as to suppress corrosion thereof.

Another object of this invention is to provide a method of manufacturing semiconductor devices, specifically, a method of selectively depositing various metals other than W on the metal and semiconductor portions of the device.

Briefly, in accordance with one aspect of this invention, there is provided a method which comprises the steps of selectively forming metal leads on the surface of a semiconductor substrate, and immersing the semiconductor substrate in a solution containing metal, whereby depositing the metal separated from the solution on the surfaces of the metal leads.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
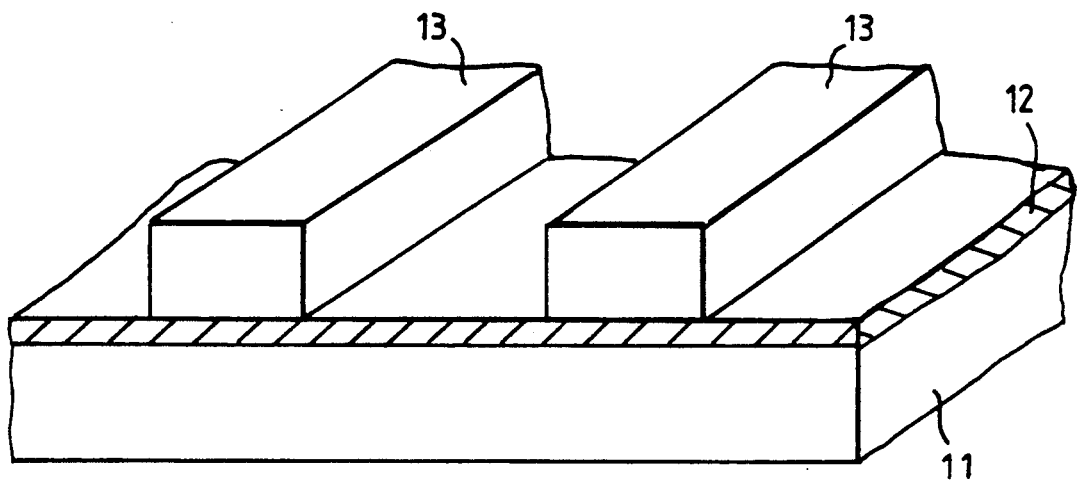
FIGS. 1a and 1b are perspective cross-sectional views for explaining a first embodiment according to the present invention.

In accordance with one embodiment of this invention, a semiconductor substrate on which metal films have been formed is immersed in a solution containing metal. The metal in the solution is separated therefrom and deposited on the metal films. In another case, the metal on the metal films on the substrate is substituted by the metal separated from the solution. As a result, corrosion of the metal film surface can be prevented. In another case, an Al-Si-Cu alloy film on which halogen elements such as F or Cl are adhered is immersed in a solution containing metal having an ionization tendency equal to or smaller than that of Al. As a result, corrosion of the alloy film can be prevented.

An alloy of the Al-Si-Cu group has a reliability higher than that of Al or an Al-Si alloy in terms of antielectromigration. Thus, an Al-Si-Cu alloy is best used as a material of metal leads in a semiconductor device. However, when the metal leads of an Al-Si-Cu alloy is immersed in a water solution, oxidation and reduction can occur in the solution. This is because an Al-Si-Cu alloy has an electrochemical electrode potential difference between two different metals (cell effect). Thus, even when an Al-Si-Cu alloy is immersed in a water solution having substantially no impurities (so-called high-purity water), corrosion accompanied with the growth of $Al(OH_3)$ occurs.

Further, if F or Cl is adhered to the surface of an Al-Si-Cu alloy, corrosion accompanied with the growth of HF or HCl occurs significantly when the alloy is immersed in high-purity water. Here, if an Al-Si-Cu alloy is immersed in a solution containing Fe which is metal having an ionization tendency smaller than that of Al, Fe is separated from the solution and deposited on the surface of an Al-Si-Cu alloy. Further, if F or Cl is adhered to the surface of such an alloy, and when the alloy is immersed in the solution containing Fe, F or Cl becomes HF or HCl and dissolves in the solution. At the same time, Fe is separated from the solution, and deposited on the surface of the alloy. Thus, corrosion of the alloy surface does not occur.

As described above, when the metal contained in a solution is appropriately selected with respect to the metal of Al-Si-Cu alloy films, satisfactory results can be obtained as follows. Specifically, the metal can be separated from the solution, and deposited on the surface of an Al-Si-Cu alloy. Further, F or Cl, which is adhered to the surface of this alloy, can be eliminated. In the case of Al or an Al-Si alloy, this metal has less cell effect, and is inherently corrosion-resistant. However, if F or Cl is adhered to the surface of such metal, and when the metal is immersed in a solution, corrosion also occurs. When Al or an Al-Si alloy with F or Cl adhered is immersed in a solution containing Fe, the Fe is also separated from the solution, and deposited on the surface of the metal. In this case, the amount of Fe deposited on the surface of the Al or an Al-Si alloy is smaller than that in the case of an Al-Si-Cu alloy. At the same time, F or Cl adhered to the surface of the Al or an Al-Si alloy is eliminated, and corrosion thereof can be prevented. As described above, if metal, which has been appropriately selected, is deposited on the surface of an Al-Si-Cu alloy film, the alloy film can be prevented from corrosion even when it is immersed in high-purity water.

In recent years, an attempt has been made in which Cu is used instead of an Al-alloy as a material of metal leads in a semiconductor device. However, also in the case of Cu leads, if F or Cl is adhered to the surfaces of Cu leads, corrosion can easily occur when the device is immersed in a solution. In this case, such corrosion can also be prevented by immersing Cu leads in a solution containing metal.

Here, a solution containing metal includes water, an acid water solution or an alkaloid water solution, in each of which salt of metal is dissolved. The salt of metal includes nitrate, sulfate and organic acid salt. However, haloid salt is not suitable for such a solution. This is because if the concentration-of halogen negative ion in the solution is high, corrosion can no longer be prevented. Further, oxides and hydrate other than the above-described salt of metal may also be used for such a solution.

In most cases, the metal contained in a solution exists as ion. Here, the metal in the solution must have an ionization tendency smaller than that of metal or a semiconductor on the surface of a substrate to be processed. This is required in order that the metal can be separated from the solution and deposited on the substrate surface in a prescribed manner. This is obvious from the phenomena of electro-chemical oxidation and reduction. Specifically, metals to be deposited on an Al-alloy are metals having an ionization tendency smaller than that of the Al-alloy. Such metals are Zn, Fe, Ni, Sn, Pb, Cu, Ag, Pt, Au, W, Mo, Ti, Ho, Cr, Mn and Cd. In most cases, nitrate, organic acid salt or sulfate, each combining one of the above-described metals is dissolved in a water solution. Thereafter, the substrate on which Al-alloy films have been formed is immersed in the thus prepared water solution. As a result, one of the above-described metals is separated from the solution and deposited on the Al-alloy films in a prescribed manner.

As described above, in processing the surfaces of metal leads on the substrate, the metal in the solution is separated therefrom and deposited on the surfaces of the metal leads. Further, when a substance other than metal, such an $SiO_2$ film, coexists on the substrate surface, a small amount of the metal in the solution is deposited also on the $SiO_2$ film. Assume that metal leads of an Al-Si-Cu alloy are formed on an $SiO_2$ film provided on a silicon substrate. Further, this substrate is immersed in a solution containing Fe. In this case, Fe in the solution is deposited on the Al-Si-Cu alloy, and at the same time, a small amount (about 1/10 or less) of Fe is deposited also on the $SiO_2$ film. The Fe of a specified amount or more on the $SiO_2$ film becomes a contaminant that has some adverse effect on the device configuration. Thus, the unnecessary Fe deposited on the $SiO_2$ film must be eliminated. When the substrate, is washed with high-purity water alone, the amount of such Fe is reduced to about ½. In some cases, further reduction of the Fe is required for more accurate circuit configuration. In such cases, the substrate is immersed in a dilute acid solution, which dissolves the Fe.

Hereinbefore, the method of preventing corrosion has been described. However, this embodiment can also be used as a method of selectively depositing metal on the metal and semiconductor portions on a substrate. Specifically, a large amount of metal is deposited on the metal and semiconductor portions, while a small amount of metal is deposited on the insulators, such as $SiO_2$ and photoresist films on the substrate. Further, in this embodiment, when appropriate metal is deposited on the surfaces of metal leads made of an Al-Si-Cu alloy, electromigration in the metal leads can be suppressed. Particularly when one of metals such as Ni, Sn or Ho is deposited on the surface of the metal leads of Al-Si-Cu alloy, the metal leads exhibit significant anti-electromigration characteristics. In this case, if the substrate is thermally processed, such electromigration can be more effectively suppressed. This is because the metal deposited on the surfaces of metal leads is thermally diffused into the metal which originally exists in the metal leads.

In accordance with another embodiment of this invention, a semiconductor substrate on which metal films have been formed is immersed in a solution. The solution contains negative ion precluding halogen, i.e., $NO_3^-$, $SO_4^{2-}$ or $COOH^-$. As a result, a passivity layer is formed on the surface of the metal film. A passivity is a state in which metal exhibits precious metal properties. In other words, it is a state in which metal is completely covered with a thin transparent film of hydrated oxide.

In this embodiment, corrosion of the metal leads of an Al-Si-Cu alloy on the substrate can be prevented as follows. As described above, an Al-Si-Cu alloy has high reliability in anti-electromigration, but is liable to corrosion. A substrate on which metal leads of an Al-Si-Cu alloy have been formed is immersed in a solution containing $NO_3$ ion. As a result, a passivity film is formed on the surfaces of the metal leads. Thus, corrosion of the metal leads can be prevented. Further, even when F or Cl is adhered to the surfaces of the metal leads, such F or Cl is completely dissolved in the solution. In this case the concentration of the $NO_3$ ion in the solution must be 1 ppm. at a minimum. When the concentration of the $NO_3$ ion is insufficient, corrosion of the metal leads can easily occur.

Such a solution may also contain metal ion accompanied with the $NO_3$ ion. Further, when the metal ion has an ionization tendency smaller than that of the metal on the substrate, corrosion of the metal leads can be significantly prevented. For example, Fe is a metal having an ionization tendency smaller than that of Al. Thus, when the substrate to be processed is immersed in a solution containing Fe accompanied with $NO_3$ ion, satisfactory results can be obtained.

Further, even when F or Cl is adhered to the surfaces of the metal leads, such F or Cl becomes HF or HCl and is dissolved in the solution. At the same time, Fe in the solution is deposited on the surfaces of the metal leads. Thus, the metal leads can be protected from corrosion.

Here, the solution containing $NO_3$ ion is a water solution in which nitrate of metal is dissolved. The water solution may also contain other negative ions besides $NO_3$ ion. However, halogen ion of a high concentration (about 10 ppm. or more) must be avoided in this solution. Otherwise, the metal leads can be corroded.

In still another embodiment according to this invention, a semiconductor substrate, which partially exposes metal and semiconductor portions, is processed as follows. First, the substrate is immersed in a solution containing metal. The metal in the solution is chemically reduced at the surfaces of the metal and semiconductor portions, and deposited thereon. In another case, the metal in the solution is substituted by the metal atoms or semiconductor atoms of the respective surfaces, and deposited thereon. In this case, the amount of metal deposited on the insulators on the substrate is far smaller (less than 1/10) than that deposited on the metal and semiconductor portions. Therefore, even when metal and semiconductor portions coexist with insulators on the substrate, the metal in the solution can be selectively deposited on the metal and semiconductor portions on the substrate.

In the process of manufacturing semiconductor devices, the following metals are generally used for metal leads and electrodes on the substrate. Specifically, the metals are Al, an Al-alloy, refractory metals (such as W and Mo), and silicides of these metals, or Cu and an Cu alloy. These metals are used for various applications as follows. For example, one of these metals is used as a barrier which improves contact characteristics (to lower contact resistance and to enhance adhesion) between the base metal and the metal leads. Another metal is used for coating the metal leads so as to suppress their electromigration and stressmigration. Another metal is used for controlling the light reflection factor in the process of photoetching. In this embodiment, all these metals can be selectively deposited on the respective metal and semiconductor portions.

When a substrate on which insulators have been formed is immersed in a solution containing metal, the metal in the solution is deposited also on the insulators. The amount of the metal deposited on the insulators is far smaller than that deposited on the metal and semiconductor portions on the substrate. This occurs, for example, when Fe is deposited on an Al-alloy film, at the same time Fe is deposited also on $SiO_2$ films. The amount of Fe deposited on the $SiO_2$ film is far smaller than that deposited on the Al-alloy film. The Fe deposited on the $SiO_2$ films can have some adverse effect on the circuit configuration in the later processes. The unnecessary metal deposited on the $SiO_2$ film can be eliminated as follows. For example, when the surface of the $SiO_2$ film is washed with high-purity water alone, the metal deposited on the $SiO_2$ film can be reduced to about half.

Thereafter, the substrate is immersed in a dilute acid solution, which dissolves the unnecessary metal. As a result, the metal deposited on the $SiO_2$ can be completely eliminated, leaving the necessary metal on the metal and semiconductor on the substrate. This selective elimination of the metals can be achieved because of a large difference between the amounts of the necessary and unnecessary metals. Other techniques of eliminating unnecessary metal can be obtained as follows. Specifically, they are a technique of applying charged particles such as electron or ion, a technique of applying a light beam, and a technique of thermal processing. Further, a technique of applying plasma or light in an atmosphere of reactive gas can also be obtained.

In this embodiment, a method of selectively depositing metal on the metal and semiconductor portions on a substrate is provided. However, this embodiment can also be applied to a method of depositing metal on the entire surface of the metal and semiconductor portions on a substrate. In this case, metal in a solution is deposited on the entire surface of the metal and semiconductor portions on the substrate. Thereafter, the thus metal-deposited surface is patterned by etching or the like. Further, in this embodiment, after the deposition of a first metal, a second metal can be deposited selectively or in an isotropic manner by the use of another technique. For example, Ti is deposited on an Al-alloy by use of the method of this invention. Thereafter, W is selectively deposited on the thus Ti-deposited Al-alloy by using a reducing reaction of $WF_6$ gas. Further, various materials can be used for fabricating a multi-layer configuration by performing depositions several times in accordance with the methods of this invention.

Moreover, in this embodiment, metal deposited on a layer is caused to be alloyed with the base layer of a substrate. Further, a portion of the metal deposited on the layer is caused to be diffused into the base layer. As a result, a satisfactory adhesion property of the deposited metal layer with respect to the base layer can be achieved. These processes are performed by heating the substrate at prescribed temperatures. Specifically, the substrate is heated at temperatures below 500° C. to enhance the adhesion property of the deposited layer. The substrate is heated at temperatures higher than 400° C. to achieve the alloying and diffusion into an Al-alloy.

Hereinafter, referring now to the drawings, wherein like reference numerals designate identical or corresponding parts throughout the several views, and more particularly to FIG. 1 thereof, a first embodiment of this invention will be described.

FIG. 1a shows a substrate to be processed in accordance with a method of this embodiment. In FIG. 1a, an $SiO_2$ film 12 is formed on the surface of a silicon substrate 11. Two parallel-arranged metal leads 13 of an Al-Si-Cu alloy are formed on the $SiO_2$ film 12. The metal leads 13 are formed as follows. Specifically, an Al-Si-Cu alloy film is formed on the entire surface of the $SiO_2$ film 12. Thereafter, photoresist is painted on the entire surface of the alloy film. The thus painted photoresist is etched by a conventional photoetching process to form prescribed patterns. Next, the Al-Si-Cu alloy film is selectively etched using a patterned photoresist as a mask. This is performed by use of an RIE (reactive ion etching) using a gas of the Cl group. Thereafter, the photoresist is reduced to ashes by an ashing apparatus using the F group gas. As a result, the photoresist is removed.

Figure 1B:
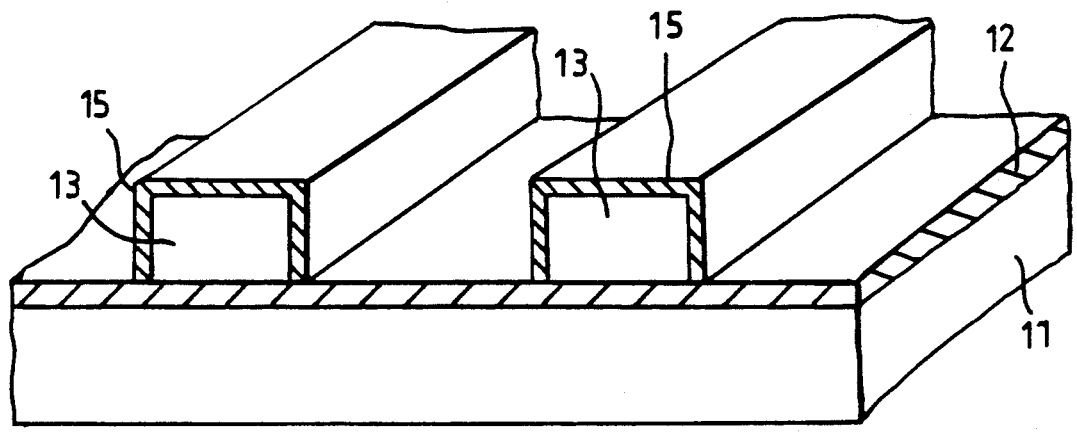

Thereafter, the substrate 11 of FIG. 1a is washed with a water solution in which Fe is dissolved as nitrate. (Fe:5 ppm; $NO_3$:30 ppm). The Fe in the water solution is separated therefrom, and is deposited on the surfaces of the metal leads 13. As a result, thin Fe films 15 are formed on the surfaces of the metal leads 13, as shown in FIG. 1b. The thin Fe films 15 are not corroded even when they are washed with high-purity water. Thus, even when the substrate 11 is immersed in the high-purity water so as to be washed, the metal leads 13 are not corroded.

In this case, a large amount of Fe is deposited on the metal leads 13 of Al-Si-Cu alloy while a far smaller amount of Fe is deposited on the $SiO_2$ film 12. The Fe deposited on the $SiO_2$ film 12 can be reduced to about half only by washing the substrate 11 with high-purity water. Further, when the substrate 11 is immersed in a very dilute acid solution (e.g., HF), Fe deposited on the $SiO_2$ film 12 can be eliminated completely. At the same time, the Fe deposited on the metal leads 13 of Al-Si-Cu alloy is also reduced. However, the amount of Fe deposited on the metal leads 23 is sufficiently larger than that of the $SiO_2$ film 12. Thus, this causes no problems.

Figure 2:
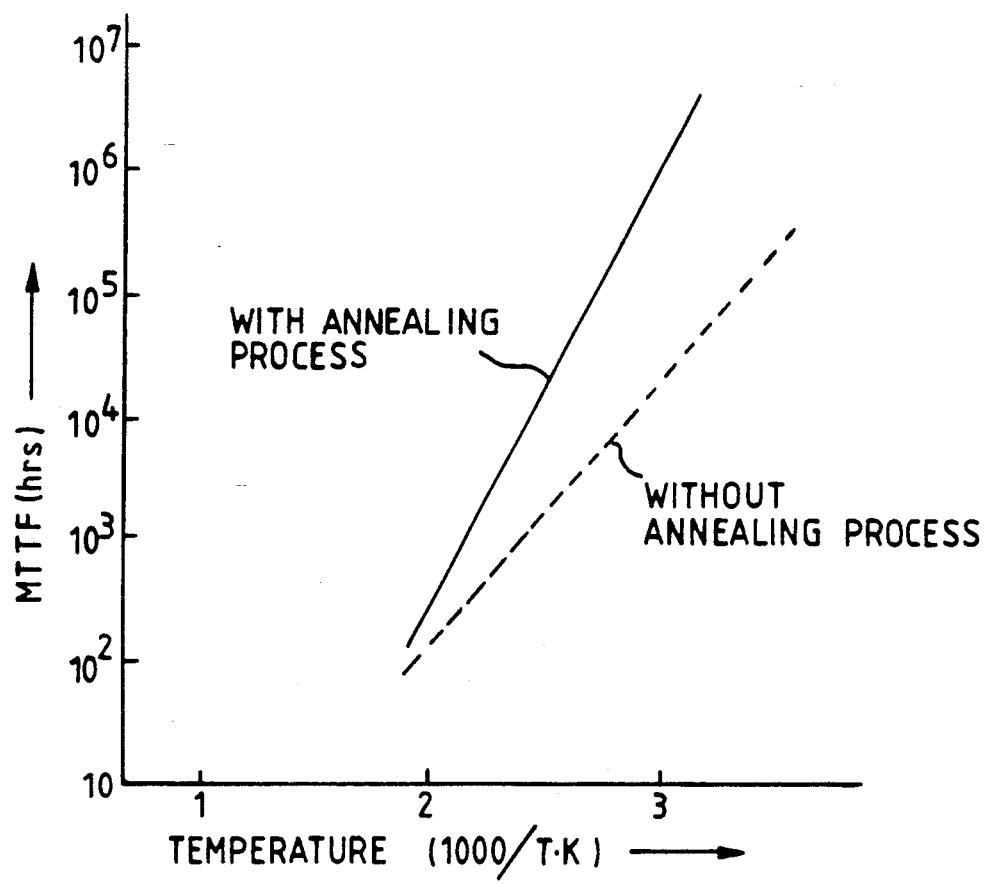
FIG. 2 is a graph illustrating temperature characteristics of a substrate processed in accordance with the first embodiment of the present invention.
Figure 3:
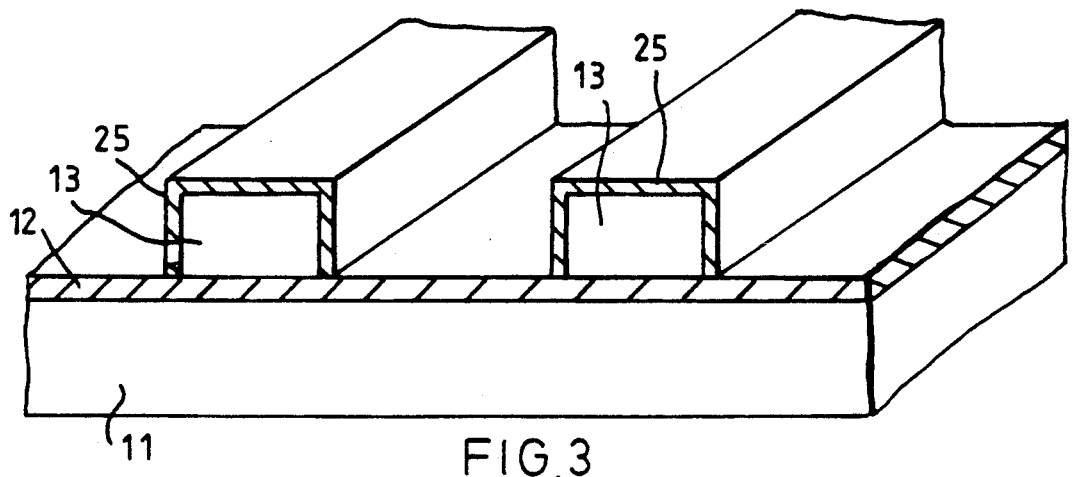
FIG. 3 is a perspective cross-sectional view for explaining a second embodiment of the present invention.

The metal leads 13 of Al-Si-Cu alloy on which Fe is deposited, exhibit significantly greater antielectromigration characteristics than those without Fe deposition. Further, the substrate 11 metal leads 13 of Al-Si-Cu alloy on which Fe has been deposited is exposed to an atmosphere of $N_2$ at 450° C. for about 30 minutes. As a result, the metal leads 13 with Fe can be annealed, and the anti-electromigration characteristics thereof can be more enhanced as shown in a graph of FIG. 2. In FIG. 2, the ordinate represents MTTF (mean time to failure) in hours, which corresponds to an average time elapsed to break the metal leads, and the abscissa represents temperature. The solid line represents the case in which the metal leads are annealed, and the dotted line represents the case in which the metal leads are not annealed.

In this embodiment, a solution containing Fe has been used. However, a solution containing various metals other than Fe can also be used. Such various metals must have an ionization tendency smaller than or equal to Al. In most cases, salt of an appropriate metal selected from such various metals is dissolved in a water solution. As a result, a prescribed solution containing metal ion can be prepared. In such cases, nitrate, sulfate or organic acid salt is used as salt. However, haloed salt is not suitable for such a solution. This is because if the concentration of halogen negative ion in a solution is high, this solution can cause corrosion of the metal leads on the substrate. Even in the case of Fe, if salt chloride is used to prepare a solution having a concentration of about 5 ppm, this solution can also cause corrosion of the metal leads.

It has been confirmed that various metals other than Fe can be used to prepare a solution containing metal ion. Such metals are Al, Zn, Ni, Sn, Pb, Cu, W, Ag, Pt, Au, Cd, Cr, Ho, Mn, Mo, Ti, Nb, Sr and Ta. The solution must have a concentration of several ppm. at most to avoid occurrence of corrosion of the metal leads. In some cases, the pH of such a solution must be predetermined to be dilute acid or alkaline before the specified salt is dissolved in the solution. In such cases, even when the pH of the solution is dilute acid or alkaline, the prescribed metal deposition and the prevention of corrosion can be achieved.

When a metal deposition is performed by using a dilute acid or alkaline solution, a substrate is washed with high-purity water. As a result, the amount of metal deposited on the $SiO_2$ film on the substrate can be reduced to about half. Thereafter, the substrate is immersed in a dilute acid solution which dissolves the metal. Thus, the metal deposited on the $SiO_2$ film on the substrate is completely eliminated. The metal deposited on the $SiO_2$ film can also be eliminated by dry-washing techniques, such as a plasma-applying technique or a light beam-applying technique.

Next, a second embodiment according to the present invention will be described. In this embodiment, a solution containing $NO_3$ ion is employed.

The substrate of FIG. 1a is immersed in a solution which dissolves nitrate of Al (Al:1 ppm., $NO_3$:30 ppm.) As a result, passivity films 25 are formed on metal leads 13 of Al-Si-Cu alloy. The existence of passivity films 25 can prevent corrosion of the metal leads 13. Thus, even when the substrate is washed with high-purity water, the widths of metal lead 13 are not reduced. In this embodiment, the Al in the solution is separated therefrom, and selectively deposited on the metal leads 13 of Al-Si-Cu alloy and the $SiO_2$ film 12. The amount of Al deposited on the $SiO_2$ film 12 is far smaller than that of the metal leads 13. The amount of Al deposited on the $SiO_2$ film 12 can be reduced to about half only by washing the substrate 11 with high-purity water. Further, if the substrate 11 is immersed in a very dilute acid solution (e.g., HF), the Al deposited on the $SiO_2$ film 12 can be eliminated completely. At the same time, Al deposited on the metal leads 13 of Al-Si-Cu alloy is also reduced. However, the amount of Al deposited on the metal leads 13 is sufficiently larger than that of the $SiO_2$ film 12. Thus, this reduction of Al causes no problems.

As described above, when Al is deposited on the surface of the metal leads of Al-Si-Cu alloy, the metal leads exhibit anti-electromigration characteristics greater than that in the case of without Al-deposition. Metal leads with and without Al-deposition were examined as to their reliability. As a result, it has been confirmed that the metal leads with Al-deposition can withstand for a time about twice longer than those without Al-deposition.

Hereinbefore, the case in which a solution containing both Al and $NO_3$ is used, has been described. However, even when a solution containing only $NO_3$ is used, corrosion of the metal leads can also be prevented. For example, a substrate on which metal leads of Al-Si-Cu alloy have been formed is immersed in a water solution. The water solution contains only $NO_3$ ion of about 30 ppm (other metals and negative ion [except $OH^-$] are not contained). As a result, passivity films are formed on the metal leads, and corrosion thereof can also be prevented.

In some cases, the thus formed passivity films become disadvantages when making contact with other metals in the later process. In such cases, the passivity films can be easily eliminated by using techniques as follows. Specifically, typical eliminating techniques are an etching by use of a solution, a physical technique such as Ar-sputtering, an electric discharge-chemical technique, and an RIE technique. Further, they include a light beam-applying technique, and an electron beam-applying technique.

Figure 4A:
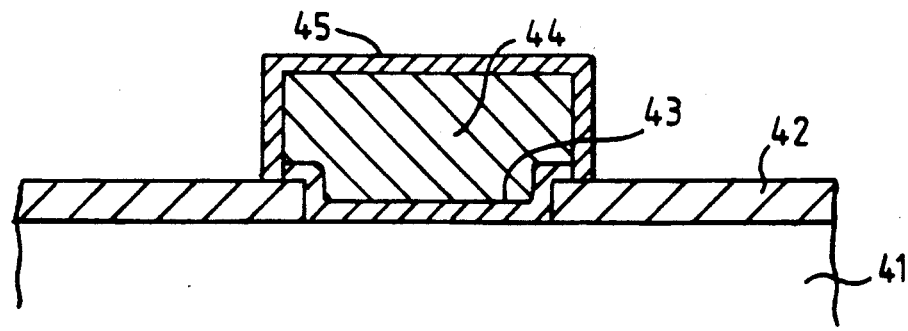
FIGS. 4a through 4c are cross-sectional views for explaining a third embodiment of the present invention.
Figure 4B:
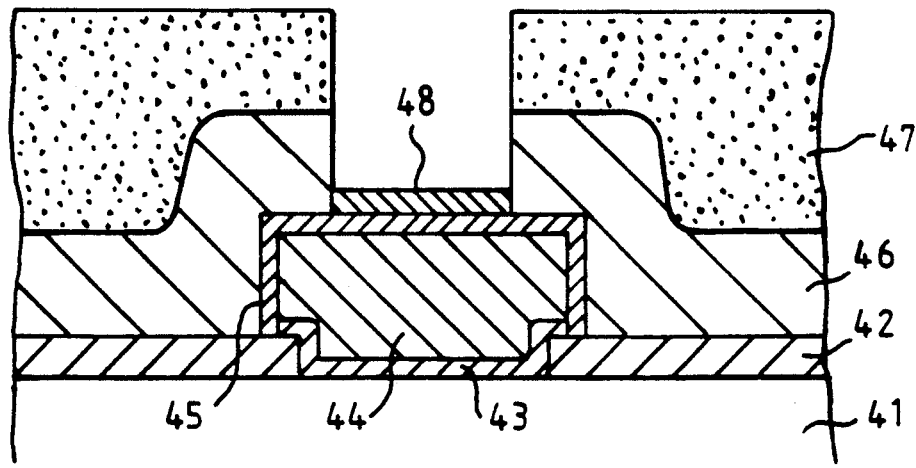
Figure 4C:
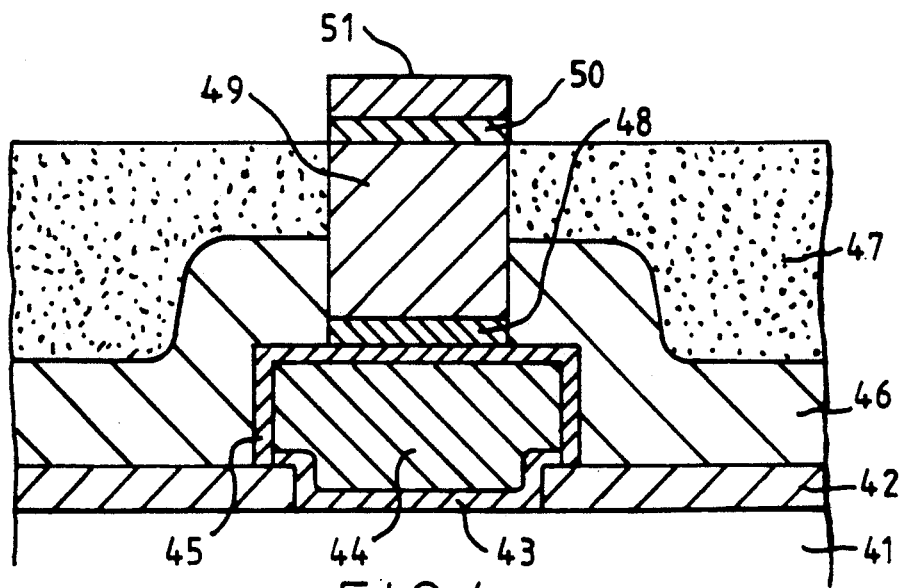

Next, a third embodiment according to the present invention will be described. FIGS. 4a through 4c are cross-sectional views illustrating the processes of forming a metal lead. A first $SiO_2$ film 42 is formed on an Si substrate 41 as shown in FIG. 4a. An opening is made in a portion of the first $SiO_2$ film 42. Next, a metal layer 43 and a second metal layer 44 are sequentially formed by a sputtering technique. The first and second layers 43 and 44 are patterned. The first metal layer 43 is made of Ti or a Ti-alloy, and the second metal layer 44 is made of an Al-alloy (e.g., Al-Si-Cu alloy).

Next, a third metal layer 45 of Ti is formed wrapping the second metal layer 44 by use of a method according to the present invention. Specifically, the substrate 41 is immersed in a solution containing nitrate of Ti. The Ti is separated from the solution, and is deposited wrapping the second metal layer 44 so as to form the third metal layer 45. In this case, most of the Ti in the solution is deposited only on the surface of the second metal layer 44, but not on the $SiO_2$ film 42. Thus, the third metal layer 45 is selectively formed on the surface of second metal layer 44. In other words, only the surface of second metal layer 44 can be convered with the third metal layer 45. The concentration of this Ti solution is about 10 ppm. The thickness of the third metal layer 45 of Ti is about 500 Å.

Next, a second $SiO_2$ film 46 is formed on the entire surfaces of the first $SiO_2$ film 42 the third metal layer 45, as shown in FIG. 4b. This is performed by use of a plasma CVD (chemical vapor deposition) technique. Next, a third $SiO_2$ film 47 is formed so as to even the surface of second $SiO_2$ film 46. This surface-evening process is performed by using a spin-on glass. Further, the second and third $SiO_2$ films 46 and 47 are selectively etched so as to make an opening therein. As a result, a part of the third metal layer 45 is exposed to the thus made opening. Next, a fourth metal layer 48 is selectively formed as follows. Specifically, the substrate 41 is immersed in a solution containing sulfate of W. The W in the solution is separated therefrom, and deposited on the exposed portion of the third metal layer 45. As a result, a fourth metal layer 48 of W is formed.

Next, a fifth metal layer 49 of W is filled in the opening as shown in FIG. 4c. This process of filling up the opening is performed by use of a selective deposition technique using $WF_6$ gas. Thereafter, sixth and seventh metal layers 50 and 51 are sequentially adhered to the fifth metal layer 49 by using a sputtering technique. Next, the sixth and seventh metal layers 50 and 51 are patterned in a prescribed manner. The first metal layer 43 serves as a barrier metal that reduces the contact resistance between the Si substrate 41 and the second metal layer 44. The second metal layer 44 serves as a metal lead in a first layer configuration. The third metal layer 45 serves as a metal that enhances both anti-electromigration and anti-stressmigration characteristics of the second metal layer 44.

Further, the fourth metal layer 48 serves as a barrier metal that reduces the contact resistance between the third metal layer 45 and the fifth metal layer 49. The fifth metal layer 49 serves as via-contact metal that bridges a gap between the first metal lead (the metal layer 44) and second metal lead (the metal layer 51) interposing metal layer 45, 48 and 50. The sixth metal layer 50 serves as a barrier metal that reduces the contact resistance between the fifth metal layer 49 and the seventh metal layer 51 (the second metal lead). The second $SiO_2$ film 46 is an insulating film that exhibits satisfactory insulation characteristics. The third $SiO_2$ film 47 is an insulating film that levels the uneven portions of the device.

As described above, various metals are used for various purposes in a semiconductor device. Further, metal leads are formed in a multi-layered configuration. Thus, a method of this invention is significantly advantageous. In particular, as shown in FIG. 4a, the third metal layer 45 of Ti can be selectively deposited on the surface of the second metal layer 44 of Al. Thus, the second metal layer 44, which serves as the metal lead of the first layer, exhibits significantly both the anti-electromigration and anti-stressmigration characteristics. Further, the fourth metal layer 48 of FIG. 4b can be selectively formed on the exposed surface of the third metal layer 45. This process can be easily performed by use of the method of this invention, which is significantly simpler than the conventional techniques. The fourth metal layer 48 serves to achieve a satisfactory contact between the second matal layer 44 of Ti and the fifth metal layer 49 of W (FIG. 4c).

Moreover, when metal in a solution is separated therefrom and deposited on the surface of a metal layer, the metal in the solution is deposited also on the surface of an $SiO_2$ film. The metal deposited on the surface of the $SiO_2$ film, which is far less than that on the metal layer, can be easily eliminated as follows. Specifically, the surface of the $SiO_2$ film is washed with high-purity water. Further, a substrate on which the $SiO_2$ film have been formed is immersed in a dilute HF solution. As a result, the metal deposited on the $SiO_2$ film can be eliminated completely. However, most of the metal deposited on the metal layer remains. The adhesion property between this metal and the metal layer can be improved when the substrate is thermally processed at about 500° C.

Figure 5A:
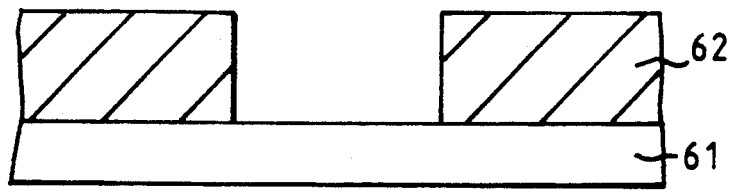
FIGS. 5a and 5b are cross-sectional views for explaining a fourth embodiment of the present invention.
Figure 5B:
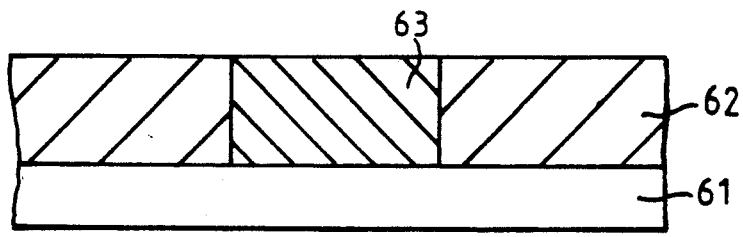

Next, a fourth embodiment according to the present invention will be described. When only the prevention of corrosion is required, a small amount of metal is separated from a solution containing the metal. However, when the formation of metal layers, per se, is required, a larger amount of metal is separated from the solution and deposited on prescribed portions. FIGS. 5a and 5b illustrate a method of selectively depositing a metal layer. In FIG. 5a, an $SiO_2$ film 62 is formed on an Si substrate 61, and an opening is made in the $SiO_2$ film 62. In FIG. 5b, metal is selectively deposited filling up the opening of the $SiO_2$ film 62 so as to form a metal layer 63 as follows.

Specifically, the Si substrate 61 of FIG. 1a is immersed in a solution containing Al. The Al in the solution is separated therefrom, and deposited filling up the opening of the $SiO_2$ film 62. As a result, the metal layer 63 is formed as shown in FIG. 5b. In this case, the solution contains $Al^+$ of 10 ppm and $NO_3$ of 60 ppm. Here, an Al layer is formed on an Si substrate. However, even when the base layer is metal, an Allayer can be selectively deposited in the same manner as above. It has also been confirmed that various metals other than Al can be similarly deposited.

Figure 6A:
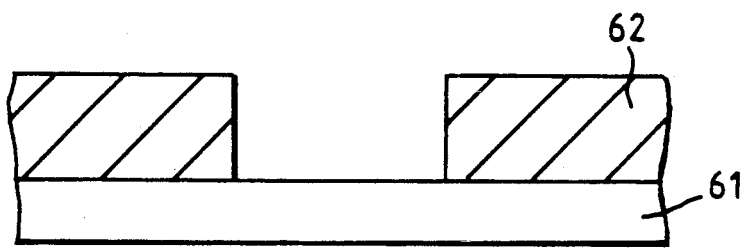
FIGS. 6a through 6c are cross-sectional views for explaining a modification of the fourth embodiment of the present invention.
Figure 6B:
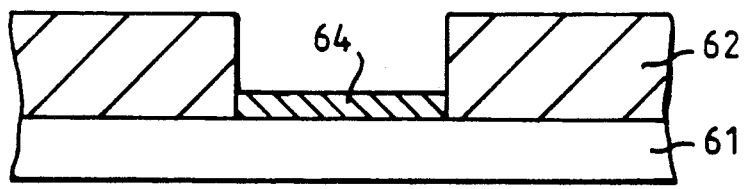
Figure 6C:
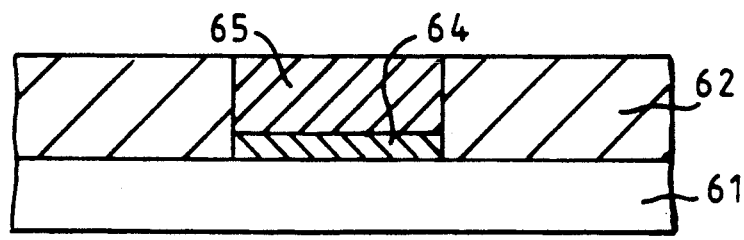
Figure 7A:
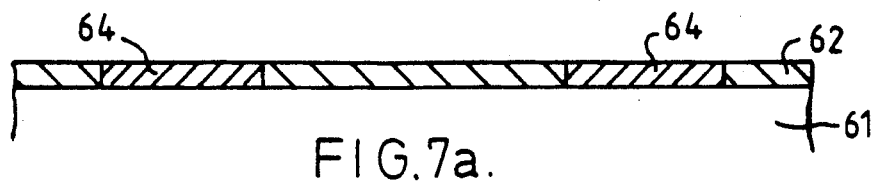
FIGS. 7a and 7b are cross-sectional views for explaining another modification of the fourth embodiment of the present invention.
Figure 7B:
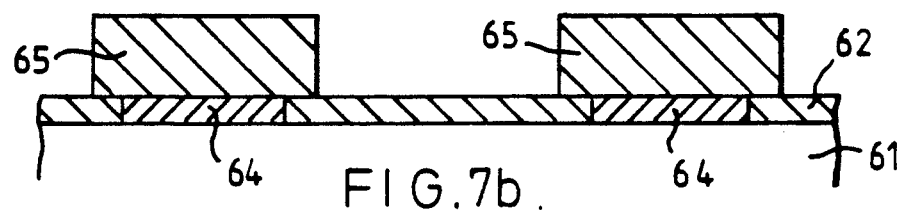

In FIG. 6a, an $SiO_2$ film 62 is formed on an Si substrate 61, and an opening is made in the $SiO_2$ film 62. Next, first metal 64 is deposited in the opening at the bottom thereof, as shown in FIG. 6b. Thereafter, second metal 65 is deposited filling up the opening, as shown in FIG. 6c. In FIG. 7a, first metal is deposited filling up the openings of an $SiO_2$ film 62 so as to form first metal layers 64. In FIG. 7b, second metal is deposited on the $SiO_2$ film 62. As described above, by use of the method according to the present invention, the selective deposition of various metals can be easily performed to form prescribed metal layers.

Figure 8A:
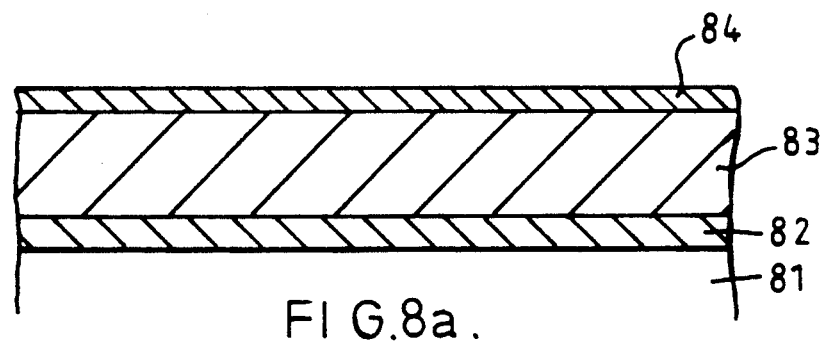
FIGS. 8a through 8c are cross-sectional views for explaining a fifth embodiment of the present invention.

Next, a fifth embodiment according to the present will be described. In this embodiment, metal is deposited on the surfaces of metal layers made of an Al-Si-Cu alloy. In FIG. 8a, an $SiO_2$ film 82 is formed on an Si substrate 81, and an Al-Si-Cu alloy layer 83 is formed on the $SiO_2$ film 82. Next, metal is deposited on the entire surface of the Al-Si-Cu alloy layer 83 so as to form a metal layer 84. In this case, various metals such as Zn, Fe, Ni, Ti, W, Ho and Mo can be deposited. The method of depositing these metals can be performed in the same manner as those described in the previous embodiments. The thickness of metal layers deposited is in the range of about 10 to about 100 Å.

Figure 8B:
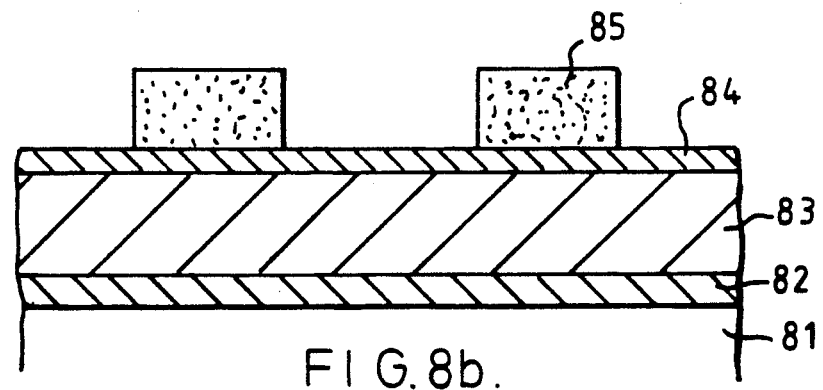
Figure 8C:
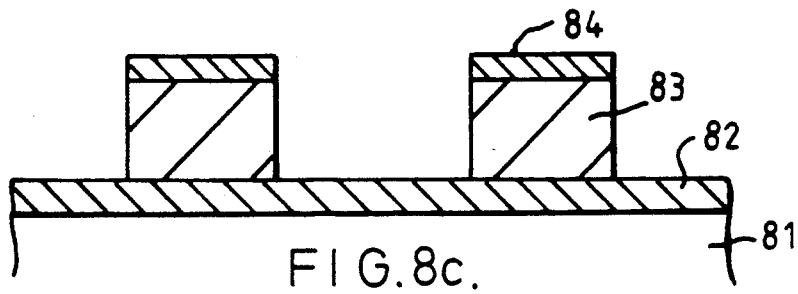

Next, a photoresist is painted uniformly on the entire surface of the metal layer 84 so as to form a photoresist film 85. The photoresist film 85 is patterned in a prescribed manner as shown in FIG. 8b. Next, the metal layer 84 is selectively etched to form metal leads using the patterned photoresist film 85 as a mask. This is performed by use of an RIE technique. Thereafter, the photoresist 85 is eliminated by use of an ashing apparatus or the like, as shown in FIG. 8c.

It has been confirmed that the surface of the Al-Si-Cu alloy film 83 is protected by the metal layer 84. As a result, the electromigration of metal leads can be significantly suppressed. Further, when the substrate 81 is thermally processed, the metal deposited on the film 83 is more securely adhered to the base metal layer. Moreover, such thermal process causes a portion of the metal deposited on the film 83 to diffuse into the base metal layer. As a result, the electromigration of metal leads can be more significantly suppressed. Next, a sixth embodiment according to the present invention will be described. In the previous embodiments, metal films such as passivity films are formed on metal leads or metal layers provided on a substrate. This is performed by immersing the substrate in a solution.

In this embodiment, ultrasonic waves are applied to the substrate which is being immersed in a solution. In the previous embodiments, metal in a solution is deposited not only on metal portion but also on other portions such as $SiO_2$ films. The unnecessary metal deposited on the $SiO_2$ film can be eliminated by use of various techniques. However, in light of the design of semiconductor devices and the productivity in the manufacturing processes thereof, it is, in some cases, required that the metal is deposited only on prescribed portions. In such cases, ultrasonic waves are applied to a substrate which is being immersed in a solution. As a result, the amount of unnecessary metal deposited on portions other than the prescribed portions can be significantly reduced.

Such ultrasonic waves can be easily applied to the substrate by using a conventional ultrasonic washing machine. The ultrasonic waves must have minimum frequencies of 600 kHz. The ultrasonic waves of less than 600 kHz can probably destroy metal leads on the substrate in the manufacturing processes.

Figure 9:
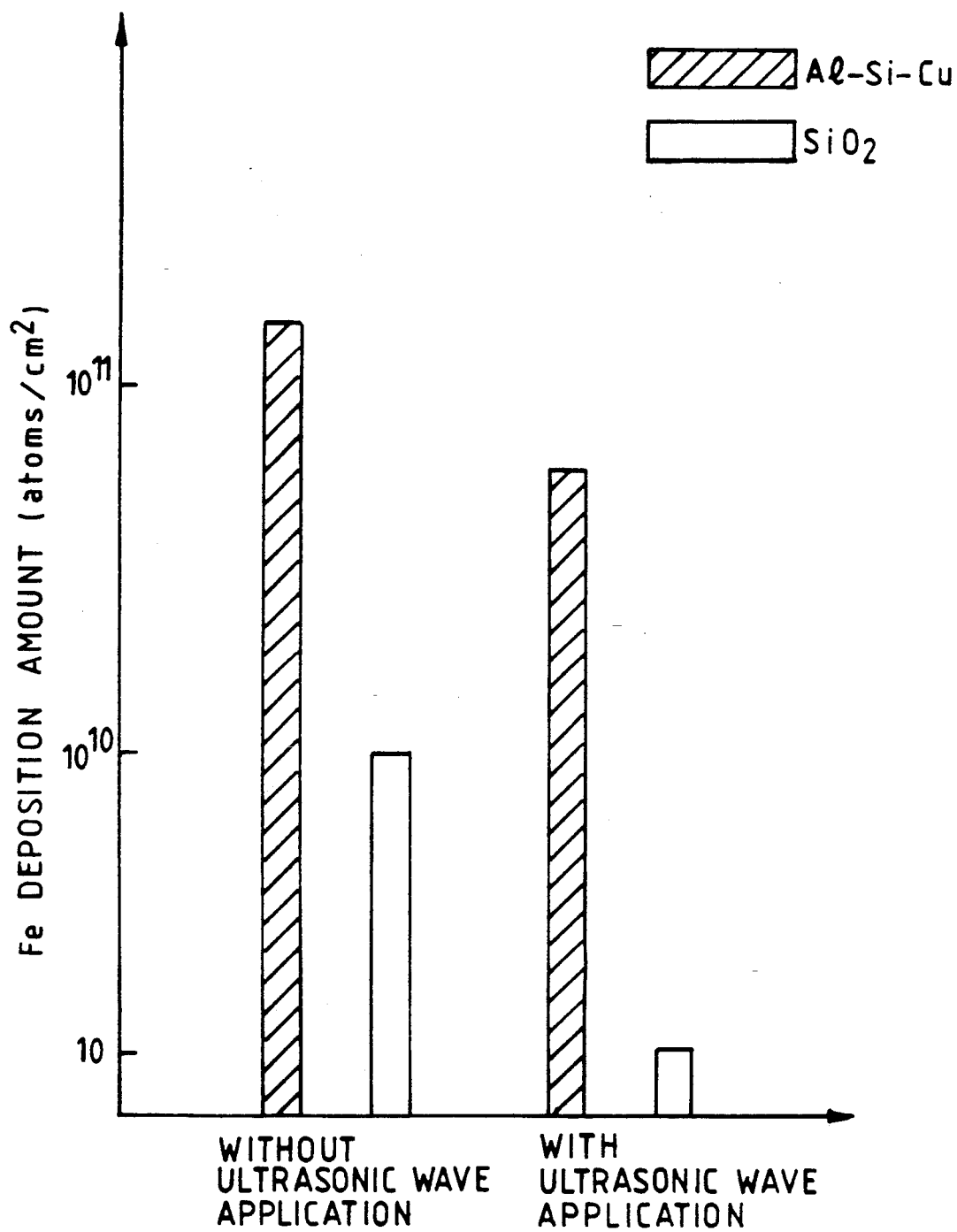
FIG. 9 is a graph for explaining the advantages of a sixth embodiment.
Figure 10:
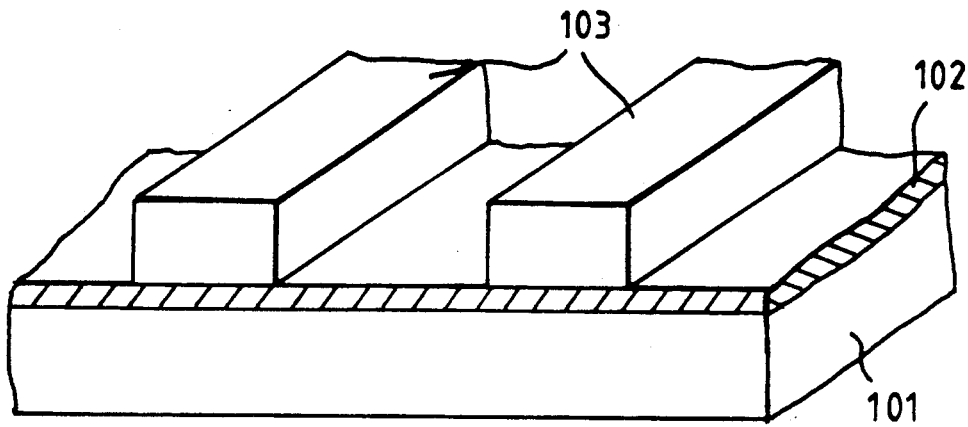
FIGS. 10 and 11 are perspective cross-sectional views for explaining a conventional technique.
Figure 11:
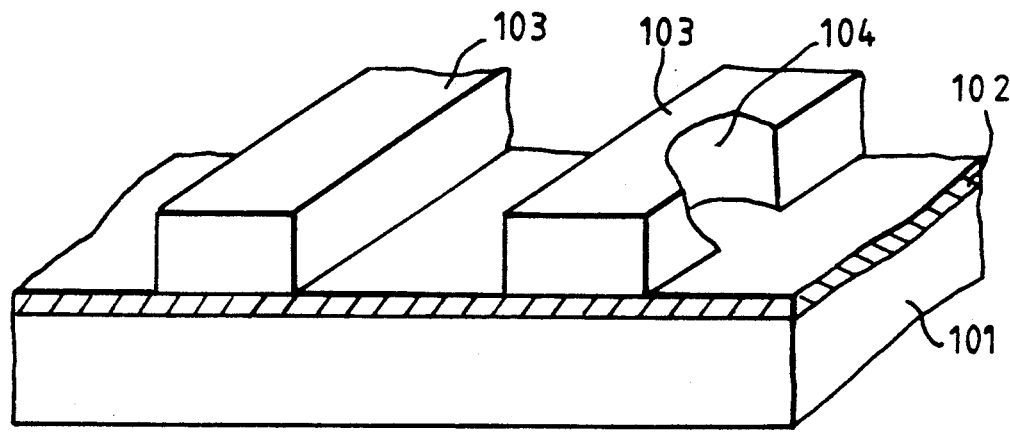

FIG. 9 shows experimental results in which the amounts of metal deposited on a metal layer and an $SiO_2$ film were measured in the cases of with and without ultrasonic wave application. Specifically, the substrate of FIG. 1a was immersed in a solution containing nitrate of Fe (Fe:5 ppm., $NO_3$:30 ppm.). Thereafter, ultrasonic waves were applied to the metal leads of an Al-Si-Cu alloy and the $SiO_2$ film on the substrate. As can be seen from FIG. 9, in the case without ultrasonic wave application, the amount of Fe deposited on the $SiO_2$ film was about 1/10 times that on the metal leads of an Al-Si-Cu alloy. In the case with ultrasonic wave application, the amount of Fe deposited on the $SiO_2$ film was about 1/100 times that on the metal leads.

In the previous embodiments, the Fe deposited on the $SiO_2$ film can be reduced to about half by washing it with high-purity water. However, in some cases, further reduction of Fe deposited on the $SiO_2$ film is required for more accurate circuit configuration. In such cases, the substrate is immersed in a dilute HF solution, for example, so as to eliminate the Fe deposited on the $SiO_2$ film.

In this embodiment, the amount of Fe deposited on the $SiO_2$ film can be sufficiently reduced by the application of ultrasonic waves. Therefore, the processes of manufacturing semiconductor devices can be significantly simplified.

Obviously, numerous additional modifications and variations of the present invention are possible in light of the above teachings. It is therefore to be understood that within the scope of the appended claims, the invention may be practiced otherwise than as specifically described herein.

What is claimed is:

1. A method of manufacturing semiconductor devices, comprising the steps of:
   forming aluminum or aluminum alloy leads on the surface of a semiconductor substrate, including a step of dry etching; and
   immersing the semiconductor substrate in a solution containing aluminum, for depositing aluminum on the exposed surfaces of the leads and for eliminating at least one of F and Cl adhering to the leads due to said dry etching, thereby suppressing electromigration and corrosion of the leads.

2. The method of claim 1, wherein said step of immersing the substrate in the solution includes the step of preparing a solution containing a aluminum-salt group.

3. The method of claim 2, wherein said aluminum-salt is aluminum nitrate.

4. The method of claim 1, further comprising the step of applying ultrasonic waves to the surfaces of the aluminum or aluminum alloy leads for enhancing the selectivity of the aluminum deposition.

5. The method of claim 4, wherein said step of applying the ultrasonic waves to the surface of the aluminum or aluminum alloy leads includes the step of providing the ultrasonic waves having frequencies of 600 kHz at a lowest.

6. The method of claim 1, further comprising the step of heating the substrate at a temperature between 400° to 500° C. to suppress electromigration of the aluminum or aluminum alloy leads.

* * * * *